US007504832B2

(12) United States Patent
Kandori et al.

(10) Patent No.: US 7,504,832 B2

(45) Date of Patent: Mar. 17, 2009

(54) ELECTRIC POTENTIAL MEASURING APPARATUS AND IMAGE FORMING APPARATUS

(75) Inventors: Atsushi Kandori, Ebina (JP); Yoshikatsu Ichimura, Tokyo (JP); Takashi Ushijima, Yokohama (JP); Yoshitaka Zaitsu, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/596,570

(22) PCT Filed: Dec. 8, 2005

(86) PCT No.: PCT/JP2005/022998

§ 371 (c)(1), (2), (4) Date: Nov. 15, 2006

(87) PCT Pub. No.: WO2006/062248

PCT Pub. Date: Jun. 15, 2006

(65) Prior Publication Data

US 2007/0170925 A1 Jul. 26, 2007

(30) Foreign Application Priority Data

Dec. 8, 2004 (JP) ............................ 2004-355120

(51) Int. Cl.
*G01R 29/12* (2006.01)

(52) U.S. Cl. .................. 324/457; 313/161; 324/117 H; 399/48

(58) Field of Classification Search ................ 324/457, 324/458
See application file for complete search history.

(56) References Cited

U.S. PATENT DOCUMENTS

| | | | | |
|---|---|---|---|---|
| 3,013,203 | A | 12/1961 | Allen et al. | |
| 3,852,667 | A * | 12/1974 | Williams et al. | 324/72 |
| 4,261,660 | A * | 4/1981 | Suzuki et al. | 399/48 |
| 4,367,948 | A * | 1/1983 | Suzuki | 399/48 |
| 4,683,436 | A * | 7/1987 | Suzuki | 324/458 |
| 4,720,682 | A | 1/1988 | Ikushima et al. | |
| 4,763,078 | A | 8/1988 | Williams | |
| 5,585,730 | A | 12/1996 | Pazda et al. | |
| 6,731,059 | B2 * | 5/2004 | Piejak | 313/493 |
| 2006/0267593 | A1 | 11/2006 | Ichimura et al. | |
| 2006/0279290 | A1 * | 12/2006 | Swenson et al. | 324/458 |
| 2007/0159159 | A1 * | 7/2007 | Okada et al. | 324/117 H |

* cited by examiner

*Primary Examiner*—Timothy J Dole
*Assistant Examiner*—Benjamin M Baldridge
(74) *Attorney, Agent, or Firm*—Fitzpatrick, Cella, Harper & Scinto

(57) ABSTRACT

An electric potential measuring apparatus includes a movable portion having a detecting electrode and a magnetic force receiver, a magnetic force generator, an electric field shield, and a detector for detecting an amount of an electric charge which is electrostatically induced on the detecting electrode. The electric field shield transmits a magnetic field generated by the magnetic force generator to make it arrive at the magnetic force receiver but shields the detecting electrode from an electric field generated by the magnetic force generator to interrupt arrival to the detecting electrode and not to substantially obstruct the detection by the detector.

11 Claims, 9 Drawing Sheets

ELECTRIC POTENTIAL MEASURING APPARATUS AND IMAGE FORMING APPARATUS

TECHNICAL FIELD

The present invention relates to a noncontact electric potential measuring apparatus and an image forming apparatus using the same.

BACKGROUND ART

In order to form a high-definition image in an electrophotographic image forming apparatus using a photosensitive member, it is necessary to control the apparatus with measuring electric potential of a charged photosensitive member. For measuring an electric potential of a photosensitive member, there is a method of performing measurement by providing a detecting electrode near the photosensitive member so as not to contact the photosensitive member, changing capacitance between the detecting electrode and photosensitive member to change periodically lines of electric force which are incident into the detecting electrode from the photosensitive member, and measuring a slight amount of charges induced on the detecting electrode by electrostatic induction. As an example of a noncontact electric potential measuring apparatus performing measurement by this method, there is an article of changing capacitance between a detecting electrode and a photosensitive member using mechanical constitution. FIG. 18 shows a conceptual structural diagram of such a noncontact electric potential measuring apparatus. In this diagram, $V_D$ denotes a surface potential of a object to be measured 501, reference numeral 102 denotes charge detection means, and $V_{OUT}$ denotes a signal outputted from the charge detection means 102. For changing mechanically capacitance $C_1$ between a detecting electrode 105 and the photosensitive member 501 which is a object to be measured, there are a method of installing a part, which changes periodically lines of electric force which are incident into a detecting electrode, between the photosensitive member 501 and detecting electrode 105, and a method of moving the detecting electrode 105 periodically. U.S. Pat. No. 4,720,682 discloses the constitution of inserting a fork-shaped shutter between a photosensitive member and a detecting electrode, interrupting periodically lines of electric force which reaches the detecting electrode from, the photosensitive member by moving periodically the shutter in a direction parallel to a surface of the photosensitive member, consequently, changing an effectual area of the detecting electrode in view of a measuring plane to change capacitance between the photosensitive member and detecting electrode.

U.S. Pat. No. 3,852,667 discloses the constitution of locating a metal shield material, having an aperture portion, in a position opposite to a object to be measured, providing a detecting electrode at a tip of a fork-shaped vibration element, changing the number of lines of electric force which reach the detecting electrode by moving a position of the detecting electrode in parallel directly under the aperture portion, and hence, changes capacitance.

U.S. Pat. No. 4,763,078 discloses the constitution of locating a detecting electrode at a tip of a cantilever-like vibrator, changing periodically a distance between a object to be measured and the detecting electrode by vibrating the vibrator, and hence, changing capacitance.

However, there are tasks described below in the above-mentioned conventional examples. A schematic diagram of an electric potential measuring apparatus for explaining this task is shown in FIG. 17. In the electric potential measuring apparatus, an actuator 108 which generates mechanical vibration for changing the capacitance $C_1$, and the detecting electrode 105 which measures electric charges induced are located. A portion to which a drive signal $V_{DRIVE}$ of an actuator is applied forms parasitic capacitance $C_2$ with the detecting electrode, and charges caused by it (hereafter, this is called "parasitic charges") is generated on the detecting electrode. As a result, the drive signal $V_{DRIVE}$ to the actuator superposes the detection signal $V_{OUT}$ from the detecting electrode which is obtained with corresponding to a surface potential $V_D$ of the photosensitive member 501. Since the detection signal $V_{OUT}$ is extremely minute, there is a possibility that detection power may drop as a result of being superposed.

DISCLOSURE OF THE INVENTION

According to an aspect of the present invention, there is provided an electric potential measuring apparatus comprising a movable portion having a detecting electrode and a magnetic force receiving means (receiver), a magnetic force generation means (generator), an electric field shielding means (shield), and a detection means (detector) for detecting an amount of an electric charge which is electrostatically induced on the detecting electrode, the electric field shielding means (shield) transmitting a magnetic field generated by the magnetic force generation means (generator) to make it arrive at the magnetic force receiving means (receiver) but shielding the detecting electrode from an electric field generated by the magnetic force generation means (generator) to interrupt arrival to the detecting electrode and not to obstruct the detection by the detection means (detector) substantially.

The electric field shielding means is preferably comprised of a nonmagnetic conductive material.

An electric potential of the electric field shielding means is preferably fixed at an arbitrary electric potential.

The electric field shielding means is preferably at the same potential as the ground potential of a current-voltage conversion circuit which the detection means has.

The magnetic force receiving means is preferably a ferromagnetic substance including a magnetized hard magnetic substance or a magnetized soft magnetic substance.

The magnetic force generation means is preferably a magnet coil.

The magnetic force generation means is preferably located in a space in which the electric field shielding means is formed.

The electric field shielding means preferably holds a wiring which the magnetic force generation means has.

According to another aspect of the present invention, there is provided an image forming apparatus comprising the electric potential measuring apparatus and an image formation control means for controlling an image formation, using the electric potential measuring apparatus.

According to still another aspect of the present invention, there is provided a method for measuring an electric potential which is comprised of the steps of:

changing a capacitance between a surface of an measuring object to be measured and a detecting electrode on a movable portion by a mechanical vibration caused by a magnetic field being generated by a magnetic force generation means and transferring as a driving force, detecting an amount of an electric charge electrostatically induced on the detecting electrode by the capacitance change to measure a surface potential of the object to be measured, transmitting the magnetic field to allow an arrival of the magnetic field at the movable portion but shielding the detecting electrode from an electric field generated by the magnetic force generation means to interrupt an arrival of the electric field at the detecting electrode by an electric field shielding means located in at least a space between the movable portion and the magnetic force generation means, whereby the detection is not substantially obstructed.

According to a further aspect of the present invention, there is provided an electric potential measuring apparatus comprising a movable portion comprised of a detecting electrode and a magnetic force receiving member, a detecting circuit which detects a signal based on an amount of electric charge electrostatically induced on the detecting electrode, an electromagnet, and an electric field shielding means provided between the movable portion and the electromagnet, the electric field shielding means transmitting a magnetic field and shielding from an electric field.

The electric potential measuring apparatus and method of the present invention can detect and measure a detection signal relating to an electric potential of a object to be measured such as a photosensitive member without being greatly influenced by a drive signal which is an alternating voltage for driving magnetic force generation means even when the magnetic force generation means, which is a driving unit to drive a movable portion magnetically, and a detecting electrode, which constitutes the movable portion, are arranged closely so that the movable portion may mechanically vibrate.

BEST MODE FOR CARRYING OUT THE INVENTION

In order to achieve the above-mentioned object, the present invention provides electric field shielding means which transmits a magnetic field, which makes a movable portion mechanically vibrate, to make it arrive at the movable portion, and interrupts an electric field which has an adverse effect on a detection signal. In the present invention, "to shield from an electric field" includes also a state of shielding imperfectly or partial shielding from an electric field while still obtaining an effect of the present invention, i.e., even if the field cannot be obstructed completely. Similarly, "to transmit a magnetic field" includes also a state of transmitting the magnetic field in the range of being able to obtain an effect of the present invention, even if it cannot transmit the entire magnetic field, that is, the state that an interrupted one exists.

Embodiments of the present invention will be explained in detail using drawings. In addition, the same reference symbols-will be used for locations having the same meanings over all the drawings.

First Embodiment

Figure 1:
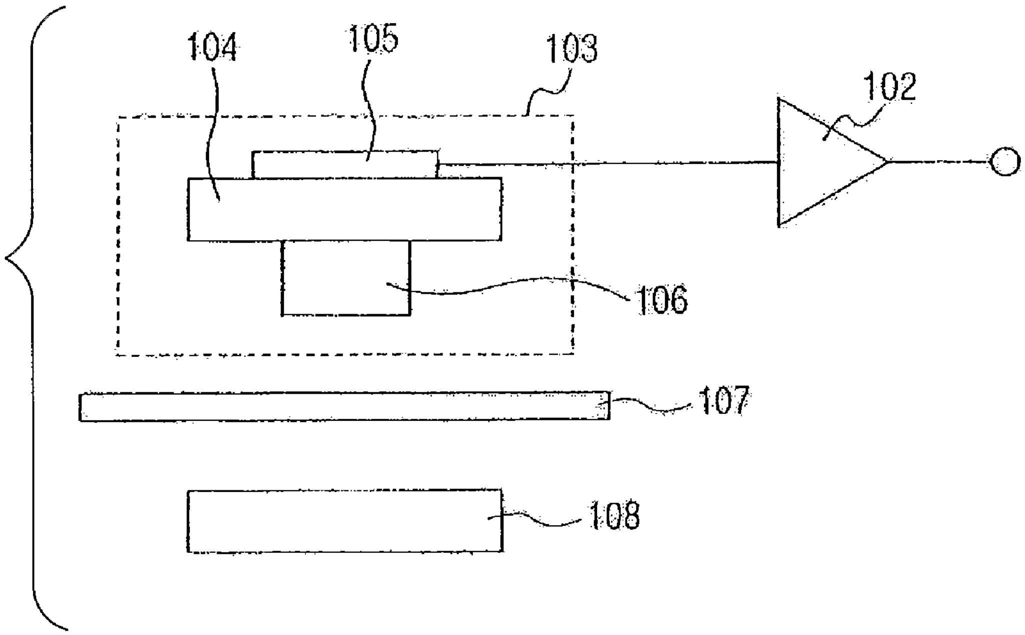
FIG. 1 is a schematic diagram for explaining an electric potential measuring apparatus according to a first embodiment of the present invention.

In an electric potential measuring apparatus of this embodiment shown schematically in FIG. 1, so as to change capacitance between an object to be measured and a detecting electrode 105, magnetic force generation means 108 gives mechanical vibration to a movable portion 103 comprised of a detecting electrode. A magnetic force receiving means 106 is located in a back face of movable plate 104. The detecting electrode 105 is located on a front face of the movable plate 104. A magnetic force is transmitted to the magnetic force receiving means 106 by an alternating current period magnetic field generated by applying an alternating current drive signal to the magnetic force generation means 108, and the movable plate 104 and detecting electrode 105 which are unified with the magnetic force receiving means 106 are driven to vibrate in an alternating current period. As a result, capacitance between a surface of the object to be measured and the detecting electrodes 105 changes. Electrostatic induction of electric charges corresponding to a surface potential of the object to be measured is performed on the detecting electrode 105 by a change of this capacitance.

The detection means 102 detects an amount of electric charges induced on the detecting electrode 105 in correspondence to the surface potential of the object to be measured, performs current-voltage conversion, converts it to a detection signal corresponding to the surface potential, and outputs it.

On the other hand, since the magnetic force generation means 108 itself also has an electric potential corresponding to the alternating voltage applied, parasitic capacitance is formed between the detecting electrode 105 and magnetic force generation means 108 with another electric potential, and parasitic charges by the electric potential by the other electric potential are induced on the detecting electrode 105. In consequence, a signal based on the parasitic charges, i.e., a drive signal of the magnetic force generation means is superposed on a detection signal which is obtained with corresponding to a periodic change of capacitance between with the object to be measured. However, since the parasitic charges do not correspond to the surface potential of the object to be measured, and has amplitude which cannot be disregarded in comparison with electric charges induced with corresponding to the object to be measured, a signal obtained by the superposition becomes a detection signal including an error.

Figure 2:
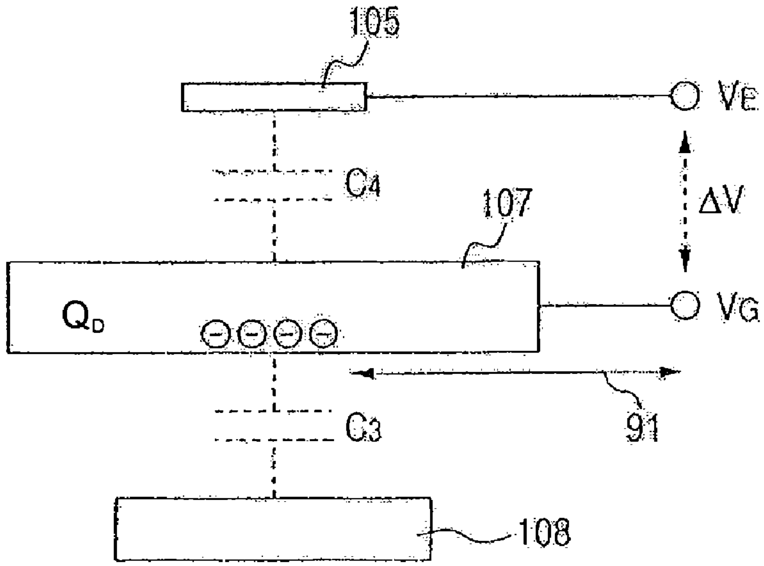
FIG. 2 is a schematic diagram for explaining a function of electric field shielding means according to the first embodiment.

Then, in this embodiment, electric field shielding means 107 made of a conductive material which is a nonmagnetic substance, which substance is also called a "feeble magnetic substance", such as a paramagnetic substance, or a diamagnetic substance, for example, aluminum, copper, or a kind of stainless steel is located between the movable portion 103 and magnetic force generation means 108. FIG. 2 shows a schematic diagram for explaining a function of the electric field shielding means 107 in this embodiment. Since the electric field shielding means 107, which is constituted of a nonmagnetic substance, transmits mostly a magnetic field generated in the magnetic force generation means 108, the magnetic field is transmitted to the magnetic force receiving means 106 as energy of driving the movable portion 103. On the other hand, the electric field shielding means 107 forms parasitic capacitance $C_3$ with the magnetic force generation means 108. Therefore, on the electric field shielding means 107, electric charges $Q_D$ are induced by a drive signal applied to the magnetic force generation means 108. Since the electric field shielding means 107 is grounded by a part with a certain fixed electric potential $V_G$ for its electric potential to be fixed, the induced charges $Q_D$ by this drive signal flow along a surface of the electroconductive electric field shielding means 107 or are grounded, for example, as shown by arrow 91. Hence, the drive signal of the magnetic force generation means 108 never induces electric charges on the detecting electrode 105. In this way, it is possible to shield from the electric field, which the magnetic force generation means 108 generates, by the electric field shielding means 107 from the movable portion 103 which is comprised of the detecting electrode 105. In addition, in FIG. 2, $V_E$ denotes an electric potential of the detecting electrode 105, and ΔV denotes a potential difference between $V_E$ and $V_G$. Since this potential difference ΔV can be made very small in comparison with the electric potential of an object to be measured as mentioned later in the description of a third embodiment, it is almost uninfluential.

Second Embodiment

An electric potential measuring apparatus according to a second embodiment has features about a circuit which detection means has. Others are the same as the first embodiment.

The detection means 102 detects an amount of electric charges induced in the detecting electrode 105 in correspondence to the surface potential of the object to be measured, performs current-voltage conversion, converts it to a detection signal corresponding to the surface potential, and outputs it.

Figure 3:
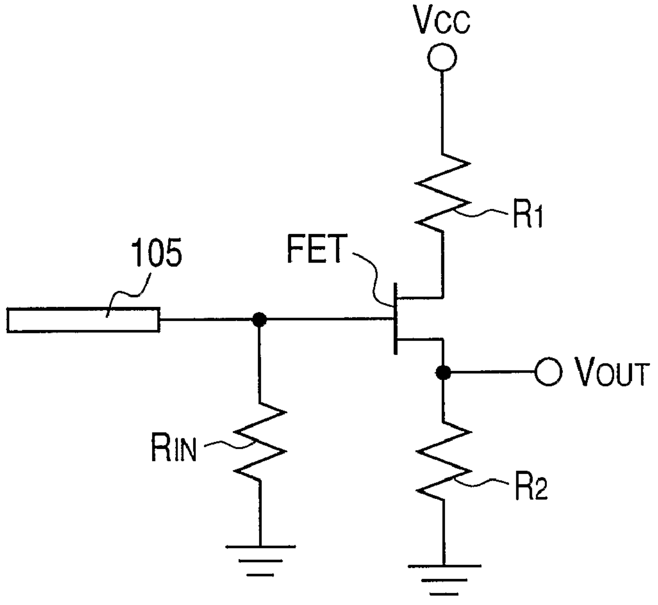
FIG. 3 is a schematic diagram for explaining an example of a circuit of detection means of an electric potential measuring apparatus according to a second embodiment.

FIG. 3 shows an FET source follower circuit which uses high resistance, and which detection means of constituting the electric potential measuring apparatus of this embodiment has. This FET source follower circuit converts a very small current, which flows in a high resistance resistor $R_{IN}$ with induced charges, into a voltage in both ends of the high resistance resistor $R_{IN}$. Since an FET has high input impedance, a leakage current to an FET input is very small, it is suitable for current-voltage conversion of a very small current. This FET outputs a voltage in both ends of the high resistance resistor $R_{IN}$ outputted as $V_{OUT}$ with conversion into low power output impedance. In addition, in FIG. 3, $R_1$ and $R_2$ denote resistors, respectively.

It is possible to perform a high gain of current-voltage conversion by using the circuit in FIG. 3. However, in a conventional electric potential measuring apparatus, as a gain of current-voltage conversion becomes high, an amplitude of an error signal included in a detection signal derived from the inductive charges by the drive signal of the magnetic force generation means 108 also becomes large. Since it is possible to reduce the error signal derived from the drive signal by using the constitution of the first embodiment, even if the circuit in FIG. 3 is used, it is possible to perform a high gain of current-voltage conversion without decrease of detection power. Consequently, it is possible to convert the electric charges induced to the detecting electrode 105 into a larger output signal, and detection power improves.

Figure 4:
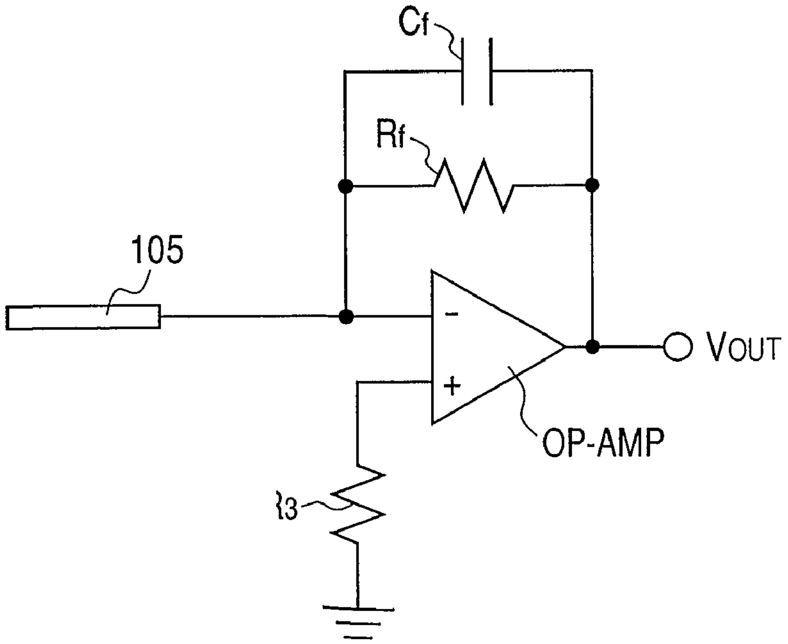
FIG. 4 is a schematic diagram for explaining another example of the circuit of detection means of the electric potential measuring apparatus according to the second embodiment.

FIG. 4 shows a trans-impedance circuit which uses an operational amplifier, and which the detection means of constituting the electric potential measuring apparatus of this embodiment has. This trans-impedance circuit is a circuit using a mechanism of negative feedback of an operational amplifier (OP-AMP). It is possible by using a broadband operational amplifier to perform a high gain of current-voltage conversion also to the movable portion 103 whose vibration frequency is high. Since it is possible to increase an acquisition frequency of the detection signal per unit time when the vibration frequency of the movable portion 103 is high, it is possible to increase detection precision. In addition, in FIG. 4, $R_3$ denotes a high resistance resistor, $R_f$ denotes a feedback resistor, and $C_f$ denotes a feedback capacitor.

Since it is possible to reduce the error signal derived from the drive signal of the magnetic force generation means 108 by using the constitution of the first embodiment, even if the circuit in FIG. 4 is used, it is possible to perform a high gain of current-voltage conversion, which achieves a high vibration frequency of the movable portion 103, but never decreases detection power. Consequently, it is possible to convert the electric charges, which are induced on the detecting electrode 105 by the surface potential of the object to be measured, into a high-speed and larger output signal, and detection power improves.

Third Embodiment

An electric potential measuring apparatus according to a third embodiment has features about a fixed potential of the electric field shielding means 107. Others are the same as the second embodiment.

In this embodiment, it is a different respect from the second embodiment to ground the electric field shielding means 107 to the ground potential of the current-voltage conversion circuit of the second embodiment.

Hereafter, the meaning of grounding the electric field shielding means 107 to the ground potential will be explained using FIGS. 1 and 2.

Let the case that a certain potential difference ΔV exists between the fixed potential $V_G$ of the electric field shielding means 107 and the electric potential $V_E$ of the detecting electrode 105 be considered. Certain parasitic capacitance $C_4$ exists between the electric field shielding means 107 and detecting electrode 105. While the movable portion 103 stands still, the induced charges of electric charges caused by the potential difference ΔV which are induced on the detecting electrode 105 do not change substantially. When electric potential measurement is started and the movable portion 103 becomes in a vibrational state, electric charges derived from the potential difference ΔV are induced on the detecting electrode 105 in a period of vibration, and the induced charges on the detecting electrode change.

Since the electric potential measuring apparatus, using only the circuit described in the second embodiment, or the like which does not have a device of the third embodiment, performs the high-gain current-voltage conversion, even very small induced charges also are outputted as an error signal. In addition, since a distance between the electric field shielding means 107 and detecting electrode 105 is short in comparison with a distance between the object to be measured and detecting electrode 105, the parasitic capacitance $C_4$ becomes a comparatively large value, and hence, the amount of electric charges to be induced increases. Therefore, the error signal outputted also becomes large. Thus, when the potential difference ΔV exists, an S/N ratio drops and the detection power of an electric potential measuring apparatus drops.

Next, let the case that the potential difference ΔV between the fixed potential $V_G$ of the electric field shielding means 107 and the electric potential $V_E$ of the detecting electrode 105 is 0 be considered. In this case, since the potential difference ΔV=0 regardless of the largeness of the parasitic capacitance $C_4$ even when the movable portion 103 becomes in a vibrational state, induction of electric charges is not generated. Hence, the error signal derived from the potential difference ΔV is never outputted.

Let the case that the electric field shielding means 107 is grounded to the ground potential of the current-voltage conversion circuit in the second embodiment be considered. In the circuit in FIG. 3, since the voltage between the circuit ground and detecting electrode 105 is detected, the potential difference ΔV exists. On the other hand, in a first stage of amplifying unit of a general electric potential measuring apparatus, voltage conversion is performed to the extent of several μV to hundreds of mV as an example by a current-voltage conversion circuit. Therefore, the potential difference ΔV, which exists, in comparison with the electric potential (several volts to several kV) of an object to be measured is extremely small. Therefore, decrease of the detection power by an error signal is hardly generated.

In addition, in the circuit in FIG. 4, since a virtual short is made between input terminals of an operational amplifier, the potential difference ΔV is equal to a voltage generated in $R_3$, and hence, it is conceivable to be a similar amplitude as FIG. 3, that is, to be to the extent of several μV to hundreds of mV as an example. Therefore, decrease of the detection power by an error signal is hardly generated also in the circuit in FIG. 4.

As discussed above, since the electric potential of the electric field shielding means 107 is fixable according to the third embodiment so that an error within a detection signal may become small, it is possible to provide an electric potential measuring apparatus with little decrease of detection power.

Figure 5:
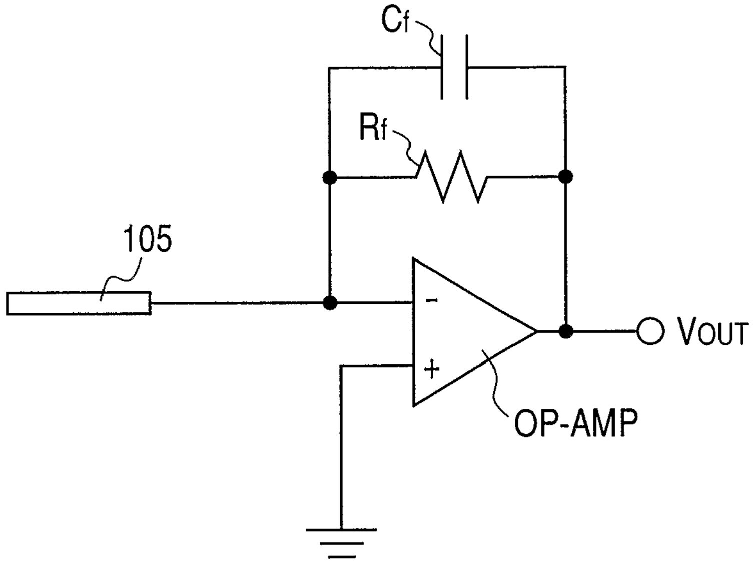
FIG. 5 is a schematic diagram for explaining an example of a circuit of detection means of an electric potential measuring apparatus according to a third embodiment.

FIG. 5 shows a modified circuit of the circuit of FIG. 4. A respect that the circuit of FIG. 5 differs from the circuit of FIG. 4 is that the high resistance resistor $R_3$ in the circuit of FIG. 4 is omitted. Namely, it is possible to regard that the detecting electrode 105 in the circuit of FIG. 4 virtually grounded is the circuit of FIG. 5. In the circuit of FIG. 5, although the potential difference ΔV of an input bias voltage of an operational amplifier (OP-AMP) exists strictly speaking, it can be ignored to an electric potential of the object to be measured since it is an extremely small value. Hence, an error signal included in an output signal is extremely small in the circuit of FIG. 5.

According to this modified circuit, since it is possible to fix the electric potential of the electric field shielding means 107 so that an error in a detection signal may become very small, it is possible to achieve an electric potential measuring apparatus with extremely small decrease of detection power.

Fourth Embodiment

An electric potential measuring apparatus according to a fourth embodiment has features about a shape of the electric field shielding means 107. Others are the same as any of the first embodiment or third embodiment.

Figure 6:
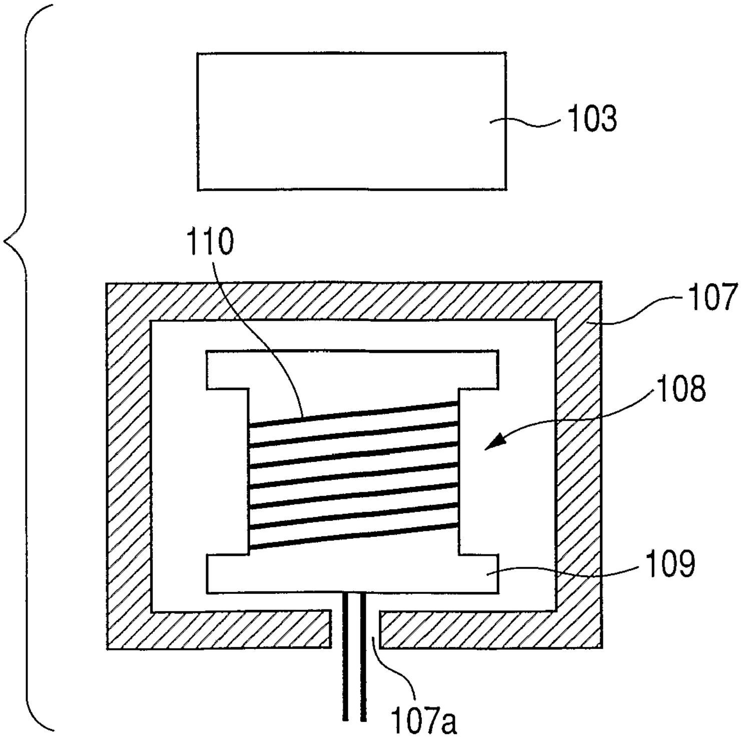
FIG. 6 is a sectional view for explaining a structural example of an electric potential measuring apparatus according to a fourth embodiment.
Figure 7:
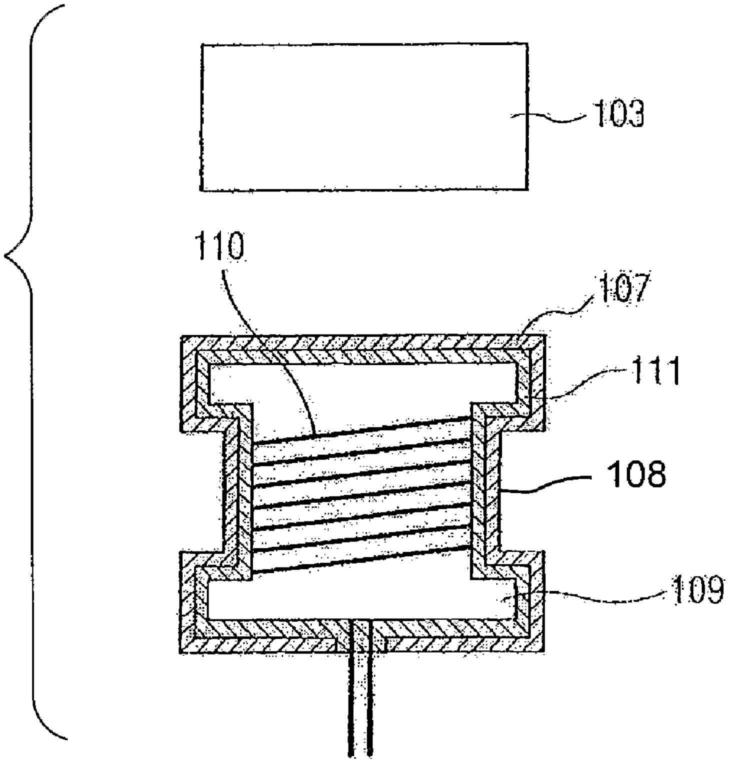
FIG. 7 is a sectional view for explaining another structural example of the electric potential measuring apparatus according to the fourth embodiment.
Figure 8:
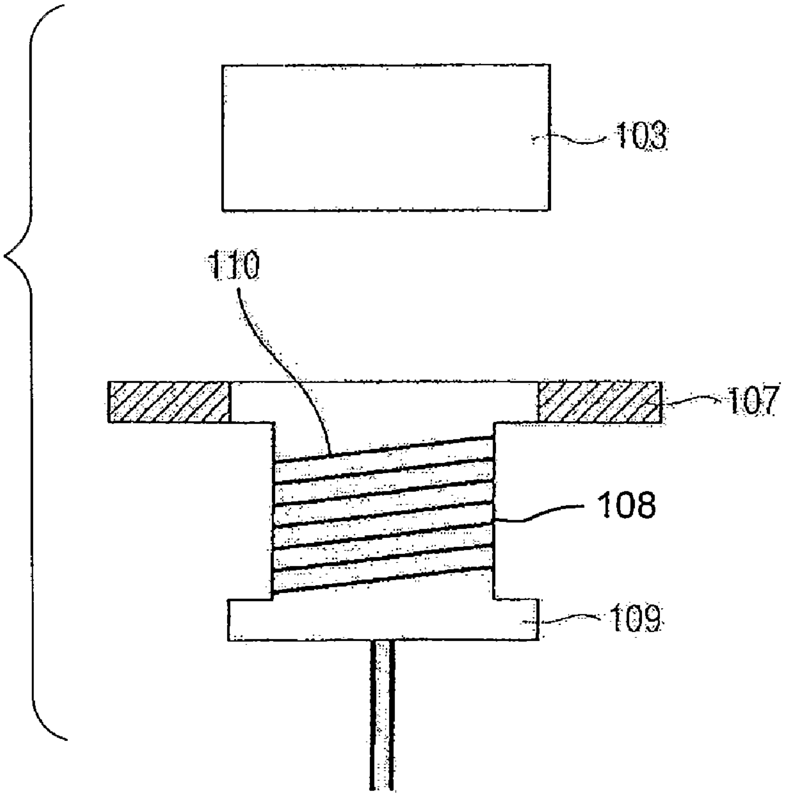
FIG. 8 is a sectional view for explaining still another structural example of the electric potential measuring apparatus according to the fourth embodiment.

FIGS. 6 to 8 show sectional views explaining the constitution of an electric potential measuring apparatus relating to each variation of this embodiment. In each diagram, the magnetic force generation means 108 is comprised of a supporting member 109, which consists of a magnetic substance or a nonmagnetic substance which has electroconductivity, and wiring 110. The supporting material 109 and wiring 110 may be sufficient so long as the supporting member 109 is constituted of an insulating material, an insulating material is located on a surface of the supporting material, or the wiring 110 which is covered with an insulating material, that is, the supporting material and wiring are insulated mutually.

A first variation of the fourth embodiment shown in FIG. 6 is characterized by covering the magnetic force generation means 108 entirely with the electric field shielding means 107. The supporting member 109 is made of an insulating material. The electric field shielding means 107 is formed of a nonmagnetic conductor, for example, aluminum. The electric field shielding means 107 is insulated from the wiring 110 of the magnetic force generation means 108. An aperture 107*a* from which the wiring 110 for the magnetic force generation means 108 is drawn out is formed in the electric field shielding means 107, and this aperture 107*a* is located in a most distant area from the movable portion 103. Even if the magnetic force generation means 108 and detecting electrode 105 (not shown) of the movable portion 103 do not directly face each other, it may be sufficient that they electrostatically couple spatially and form parasitic capacitance.

It becomes possible by the above-mentioned constitution to make the parasitic capacitance, which the magnetic force generation means 108 and detecting electrode 105 form, nearly zero. Consequently, it becomes possible to make the parasitic capacitance $C_2$ between the magnetic force generation means 108 and detecting electrode 105 nearly zero. In this way, it becomes possible to achieve completely the shielding of an electric field, generated from the magnetic force generation means 108, to the detecting electrode 105.

According to this variation, since it is possible to increase a shielding effect of an electric field from the magnetic force generation means 108, it is possible to provide an electric potential measuring apparatus which is harder to be influenced by a drive signal.

A second variation of the fourth embodiment shown in FIG. 7 is characterized by locating the electric field shielding means 107 on a surface of the magnetic force generation means 108. An insulating layer 111 is located on the wiring 110 on the surface of the magnetic force generation means, and the electric field shielding means 107 which is a conductive material is located on the insulating layer 111 on the supporting member 109 and wiring 110. In addition, leads of the wiring 110 are given insulating coating.

Since the above-described constitution of unifying the magnetic force generation means 108 and electric field shielding means 107 makes the electric field shielding means 107 simple constitution and reduces a parts count, it is possible to reduce assembly cost and the like. Hence, it is possible to provide a low-cost electric potential measuring apparatus.

A third variation of the fourth embodiment shown in FIG. 8 is characterized by a portion 107 unified with the supporting member 109 serving as electric field shielding means, and it is possible to provide a low-cost and highly-precise electric potential measuring apparatus because of simple constitution. When the supporting member 109 is constituted of the same conductive material as the electric field shielding means 107, it is possible to mold the supporting member and electric field shielding means. The electric field shielding means 107 which is unified with the supporting member 109 is fixed at a predetermined electric potential such as the ground potential. Thus, it is possible to shield the magnetic force generation means 108 from an electric field by making the electric field shielding means 107 at the predetermined electric potential.

In order to have a still more effective electric field shielding function, as shown in FIG. 8, the electric field shielding means 107 is formed so that a flange portion in a side of the movable portion 103 of the supporting member 109 may be greatly projected out in a direction of separating from an axis of a solenoid. It is possible to prevent much more effectively lines of electric force from the magnetic force generation means 108 from turning around a top face of the supporting member 109, and affecting the detecting electrode by adopting such constitution. In addition, since an insulating layer (not shown) is located between the supporting member 109 and wiring 110, the supporting member 109 and wiring 110 are insulated mutually.

When the specific resistance of the supporting member 109 and the like become problems, it is also good to adopt the constitution of locating a conductive material with lower specific resistance on a surface of the supporting member 109.

By the way, when a drive circuit applying a drive signal which generates a magnetic field, i.e., the driving force to the movable portion 103 in the magnetic force generation means 108 is unified with the magnetic force generation means 108, there arises a possibility that detection power may drop by the electrostatic coupling between the drive circuit and detecting electrode 105. In addition, since the drive circuit requires large volume in comparison with the movable portion 103 or magnetic force generation means 108, it is not easy to perform electric field shielding with simple constitution.

Then, another variation of electric potential measuring apparatus which solves this problem will be explained below using FIGS. 9 and 10.

Figure 9:
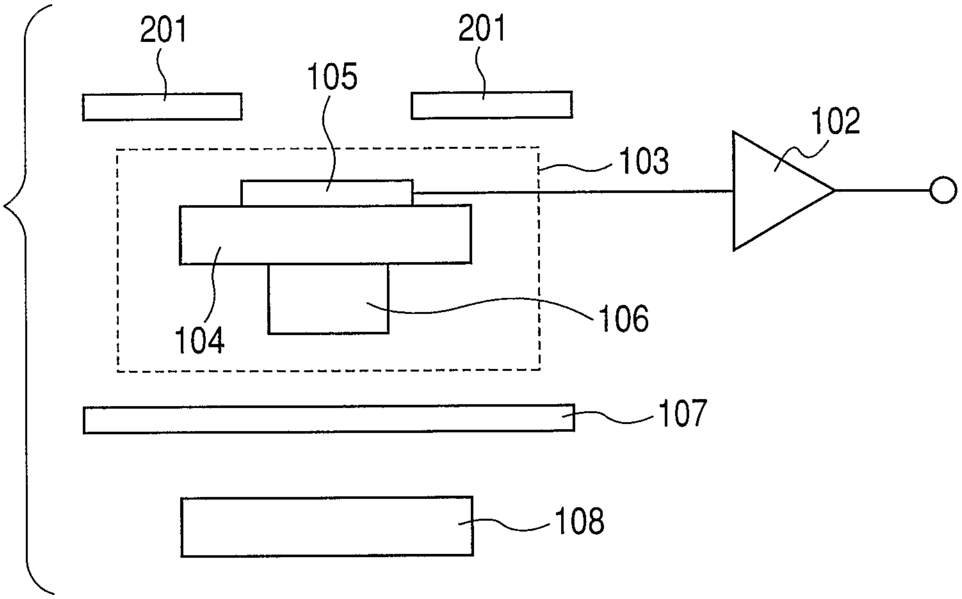
FIG. 9 is a schematic diagram for explaining further constitution of the electric potential measuring apparatus according to the fourth embodiment.

An electric field formation shield 201 which is added as a constituent in a fourth variation of the fourth embodiment shown in FIG. 9 is located between the object to be measured and detecting electrode 105. An aperture is formed in the, electric field formation shield 201 so that the detecting electrode 105 can face the object to be measured. The electric field formation shield 201 is constituted of a conductive material, and is fixed at a certain electric-potential. Since an electric field from the object to be measured surface to the detecting electrode 105, i.e., lines of electric force are formed by this electric field formation shield 201, it becomes easy that electric charges which corresponded to a surface potential of the object to be measured correctly are induced in the detecting electrode 105.

In addition, the electric field forming shield 201 also has a function of making it hard to receive electrostatic coupling from other than the object to be measured, and a function of controlling the superposition of external noise.

Figure 10:
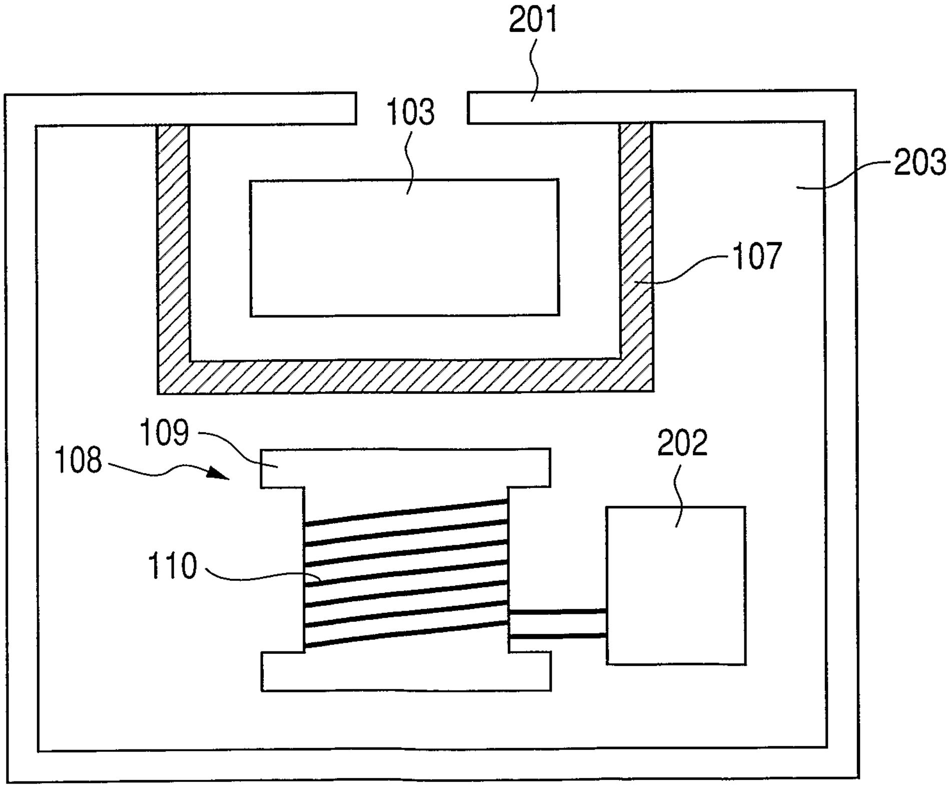
FIG. 10 is a sectional view for explaining a specific structural example of the electric potential measuring apparatus according to the fourth embodiment, the electric potential measuring apparatus which is based on the constitution in FIG. 9.

A fifth variation of the fourth embodiment shown in FIG. 10 is characterized by covering the magnetic force generation means 108 entirely with the electric field shielding means 107 and electric field formation shield 201 so as to cancel a possibility that detection power may drop by electrostatic coupling between the drive circuit and detecting electrode 105. The electric field shielding means 107 and electric field formation shield 201 are fixed at an equal potential. Since the electric field formation shield 201 is constituted of a conductive material, its part is made to perform the same operation as the electric field shielding means 107. Let a space closed by this electric field shielding means 107 and the electric field formation shield 201 be an electric field shielding space. It is possible to set the electric field shielding space arbitrarily according to a design of the electric field formation shield 201 and electric field shielding means 107. For example, as shown in FIG. 10, it is possible to locate a drive circuit 202 in addition to the magnetic force generation means 108 in the electric field shielding space 203. Therefore, it is also possible to reduce the parasitic capacitance between the drive circuit 202 and detecting electrode 105. As a result, even in the case of performing unification including the drive circuit 202, it is possible to reduce an effect of the drive signal to the detecting electrode 105 by simple constitution According to this constitution, since it is possible to achieve the constitution of making it hard to be affected by the drive signal at the time of unification including the drive circuit 202, it is possible to achieve a highly efficient electric potential measuring apparatus.

Fifth Embodiment

An electric potential measuring apparatus according to a fifth embodiment has features relating to the movable portion 103 (see, e.g., FIG. 1) which changes capacitance by mechanical vibration. Others are the same as any of the first embodiment to fourth embodiment.

Figure 11:
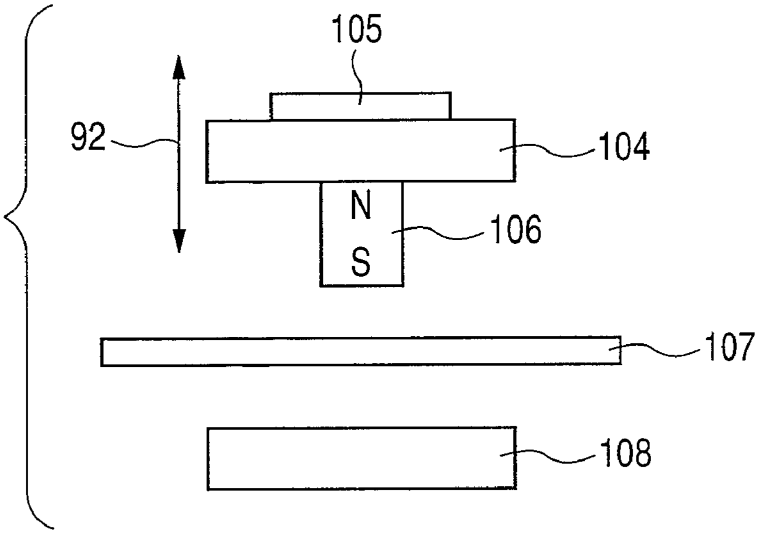
FIG. 11 is a schematic diagram for explaining a structural example of an electric potential measuring apparatus according to a fifth embodiment.

FIG. 11 shows the constitution of an electric potential measuring apparatus which is a first variation of this embodiment. A feature of this variation is that the magnetic force receiving means 106 is made of a hard magnetic substance. The magnetic force receiving means 106 is what a hard magnetic substance is magnetized, i.e., a permanent magnet, and it is attached to the movable plate 104 so that a longitudinal direction of the magnetization may become in parallel to a vibrating direction 92. In addition, this embodiment can have the constitution that a longitudinal direction of the magnetic force receiving means 106 is oriented in all the directions.

Figure 18:
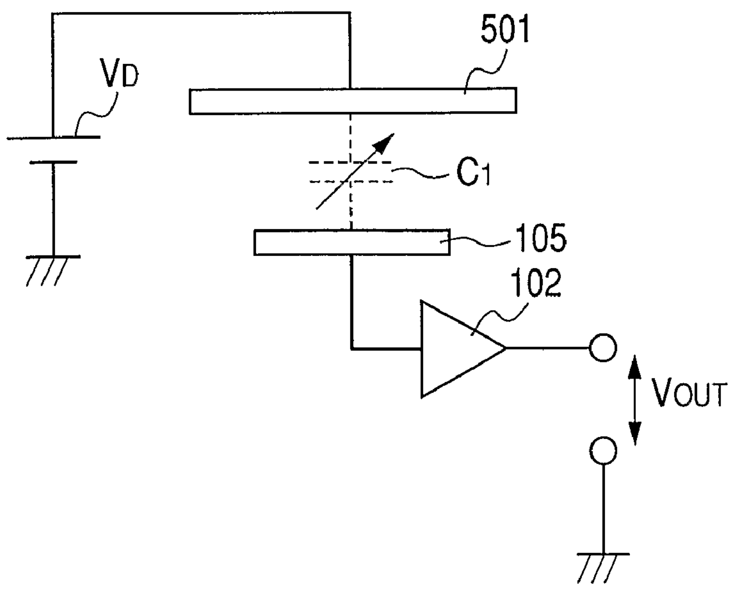
FIG. 18 is a structural diagram of a noncontact electric potential measuring apparatus.

In the variation of this embodiment, since a permanent magnet is used for the magnetic force receiving means 106, a magnetic force can be efficiently transferred by the magnetic force receiving means 106 from the magnetic force generation means 108. That is, even when a generated magnetic field is the same in comparison with the case of an electromagnet, it is possible to obtain large vibrating of the movable plate 104, which is vibration in a direction of an arrow 92 here. This leads to a change of the capacitance $C_1$(see, e.g., FIG. 18) between the surface of the object to be measured and the detecting electrodes 105 being large. Since an amount of electric charges induced on the detecting electrode 105 corresponding to an electric potential of the object to be measured is proportional to the variation of capacitance $C_1$ (see, e.g., FIG. 18) , it is possible to enlarge this amount of induced charges. Consequently, it is possible to increase the sensitivity of an output signal to a surface potential of the object to be measured.

Figure 12:
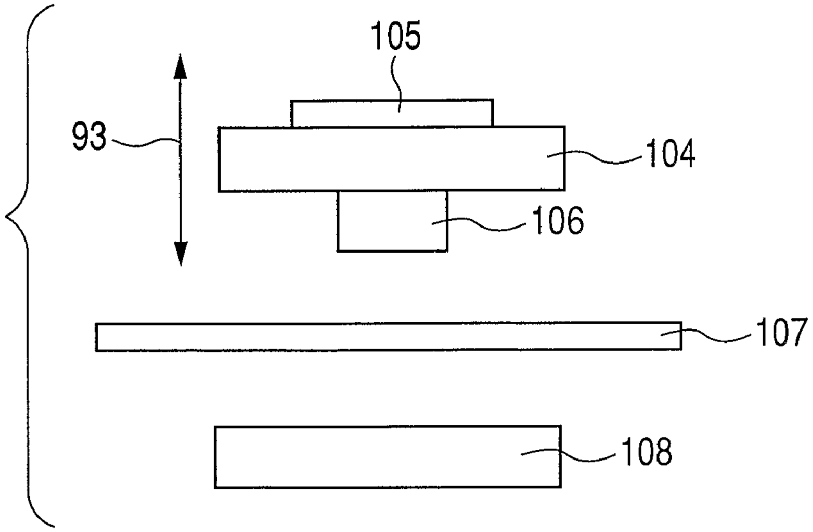
FIG. 12 is a schematic diagram for explaining another structural example of the electric potential measuring apparatus according to the fifth embodiment.

FIG. 12 shows the constitution of an electric potential measuring apparatus which is a second variation of this embodiment. A feature of this variation is that the magnetic force receiving means 106 is made from a soft magnetic substance. Hence, the magnetic force receiving means 106 does not depend on the polarity of the magnetic field generated by the magnetic force generation means 108, but it is drawn toward the magnetic force generation means 108. Therefore, the magnetic force receiving means 106 is attracted in a period, which is a half of a frequency $f_1$ applied to the magnetic force generation means 108 as a drive signal, and at a frequency which is twice the frequency $f_1$, and, vibration in a direction of an arrow 93 at a vibration frequency which is twice the drive signal is generated in the movable portion 103 (see, e.g., FIG. 1).

According to the fifth embodiment, since it is possible to improve the sensitivity of the output signal to the surface potential of the object to be measured, it is possible to provide a high-sensitivity electric potential measuring apparatus.

In general, a noncontact electric potential measuring apparatus to which capacitance between a detecting electrode and a photosensitive member is changed using mechanical constitution can perform the separating process of frequency components to a detection signal using a synchronous detection circuit, a band pass filter (not shown), or the like. Since actual vibration differs at a frequency from the frequency of a drive signal, it becomes possible to separate a superposing signal based on the drive signal, and a surface potential detection signal based on an electric potential of the object to be measured using this processing in this embodiment. Hence, it is possible to achieve the electric potential measuring apparatus hardly influenced by a drive signal by using this separating process.

In addition, it is not necessary to limit a face of the movable plate 104, where the magnetic force receiving means 106 is located in this embodiment, to a face where the detecting electrode 105 is not located. The magnetic force receiving means 106 may be located also on the face where the detecting electrode 105 is located. By locating these on the same face, the handling of each part at the time of manufacturing becomes easy, and hence, it is possible to provide a low-cost high-quality electric potential measuring apparatus. In addition, since it is possible to arrange the movable plate 104 and magnetic force generation means 108 closely when locating the magnetic force receiving means 106 on a sidewall of the movable plate 104, it is possible to transfer a magnetic force efficiently, and to provide a low-power electric potential measuring apparatus.

Sixth Embodiment

Figure 13:
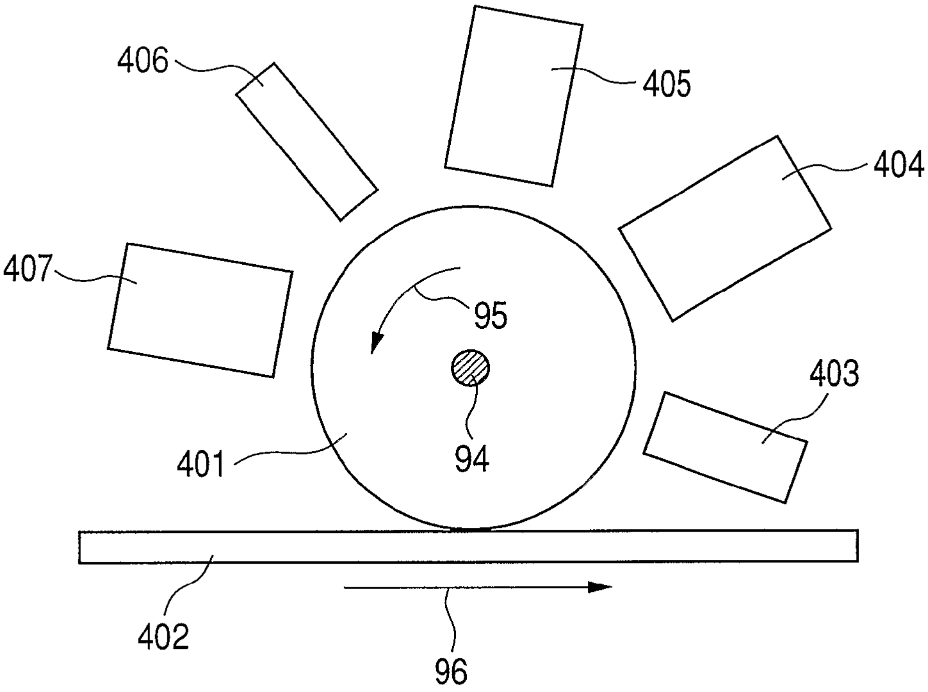
FIG. 13 is a schematic diagram for explaining the constitution of an image forming apparatus according to a sixth embodiment.

An image forming apparatus using an electric potential measuring apparatus of the present invention will be explained as a sixth embodiment using FIGS. 13, 14, and 15. FIG. 13 is a diagram showing arrangement on a plane vertical to an axis 94 of a photoconductive drum 401.

In FIG. 13, reference numeral 401 denotes a photoconductive drum, 402 denotes a sheet, 403 denotes a cleaner portion, 404 denotes charging means, 405 denotes exposure means, 406 denotes the electric potential measuring apparatus of the present invention, and 407 denotes developing means. The photoconductive drum 401 rotates toward a direction 95 with an axis 94 as a center. The photoconductive drum 401 is charged by the charging means 404, and is exposed by the exposure means 405 for a charged pattern to be formed. The electric potential measuring apparatus 406 measures an electric potential of the charged pattern on the photoconductive drum 401. The developing means 407 performs development by making only a charged pattern portion or a portion other than the charged pattern portion adsorb toner or the like, and an image is transferred on the sheet 402 scanned in a direction 96. Then, the cleaner portion 403 cleans the photoconductive drum 401. Using the measurement result in the electric potential measuring apparatus 406, an image is adjusted by controlling the charging means 404, exposure means 405, and the like.

Figure 14:
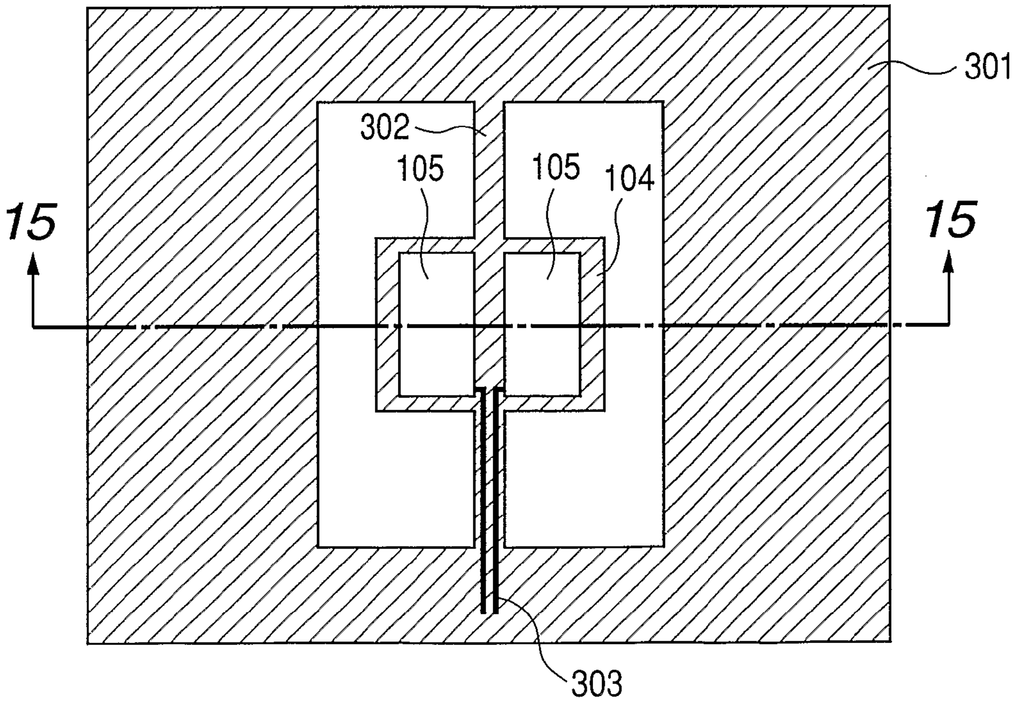
FIG. 14 is a schematic top view explaining a peripheral portion of a movable portion of an electric potential measuring apparatus inside the image forming apparatus relating to the sixth embodiment.
Figure 15:
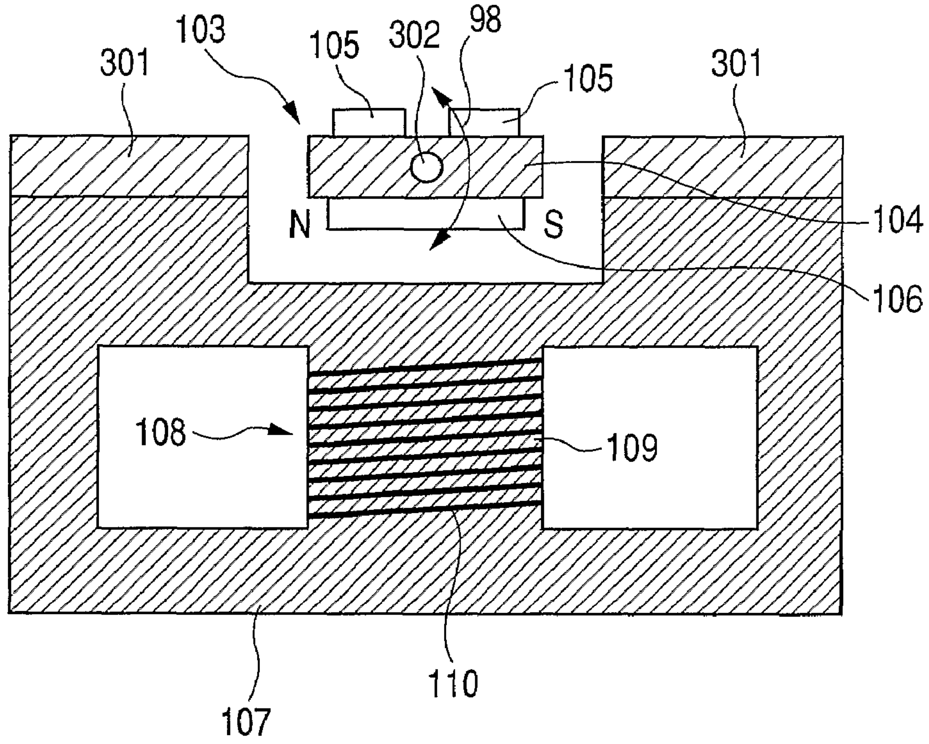
FIG. 15 is a schematic diagram for explaining a structural example of the electric potential measuring apparatus according to the sixth embodiment.

FIG. 14 is a schematic top view of the electric potential measuring apparatus 406 used in this embodiment, and is an explanatory diagram about the movable portion 103 and its vicinity. FIG. 15 is a diagram showing a section taken on line 15-15 in FIG. 14, and is an explanatory diagram about a substrate holding the movable plate 104 of the electric potential measuring apparatus 406 according to this embodiment. Reference numeral 301 denotes a substrate holding the movable plate 104, and 302 denotes a beam for supporting the movable plate 104 to the holding substrate 301. The movable plate 104, holding substrate 301, and beam 302 are formed on the same silicon substrate. This constitution is easily implemented by using micromachining technology. The detecting electrode 105 and permanent magnet 106, which is a magnetized hard magnetic substance which is magnetic force receiving means, are provided on one face and another face of the movable plate 104 respectively in the arrangement of the north pole and south pole which is shown in FIG. 15, and the movable portion 103 is constituted of them. The electric field shielding means 107 is formed by working aluminum which is a conductive material. A supporting member of the magnetic force generation means serves as a central portion 109 of the electric field shielding means 107. A portion which faces the movable portion 103 of an electric field shielding means 107 has the constitution of a concavity, and is made not to contact at the time of vibration of the movable portion. The periphery of the concavity supports the holding substrate 301 of the movable portion 103. The insulating-coated wiring 110 is located in the central portion 109 of the electric field shielding means 107 which is a lower portion of the concavity, and constitutes a magnet coil 108 as the magnetic force generation means with the central portion 109. A magnetic field is generated by flowing an AC drive current through this wiring 110. The generated magnetic field is transferred to the permanent magnet 106 which is the magnetic force receiving means, and makes the movable portion 103 perform vibration shown by an arrow 98 with a central axis of the beam 302 as a center.

An aluminum portion 107 which is the electric field shielding means is grounded in the ground of the detection circuit in FIG. 5 and the like. This makes it hard to transfer an effect of the electric field, which the magnet coil 108 generates, to the detecting electrode 105.

Hereafter, specific parameters of this embodiment will be described. In this embodiment, the size of the movable plate 104 is 1.5 mm×1 mm, and a resonance frequency is approx. 20 kHz. This is driven so that a frequency of the drive signal may coincide with this frequency.

The external dimensions of the holding substrate 301 are 10 mm×3 mm. A distance between the detecting electrode 105 and the wiring of a topmost portion of the magnetic force generation means 108 is 2 mm. The detection means 102 (not shown in FIG. 13) uses the circuit in FIG. 5, and has a current-voltage conversion gain of 50 MegV/A. When a object to be measured which has an electric potential of 1 kV in a position apart 3 mm is located, when a mechanical vibrating angle of the movable plate 104 is ±5°, an output voltage of about 100 mV is obtained from the circuit in FIG. 5. When the mechanical vibrating angle of the movable plate 104 is ±5°, an AC drive current of ±100 mA flows. Then, a signal which is superposed on the detection signal by the drive signal is 100 μV or less. Therefore, it can be said that the detection power of an object electric potential of the electric potential measuring apparatus in this constitution is nearly 1V.

Also in the case of the constitution of a small electric potential measuring apparatus where the detecting electrode 105 and magnetic force generation means 108 are arranged closely, the electric potential measuring apparatus in the image forming apparatus according to this embodiment can reduce a superposing degree of the drive signal to the detection signal. In consequence, noise becomes small and it is possible to obtain a highly-precise signal output.

Seventh Embodiment

Figure 16:
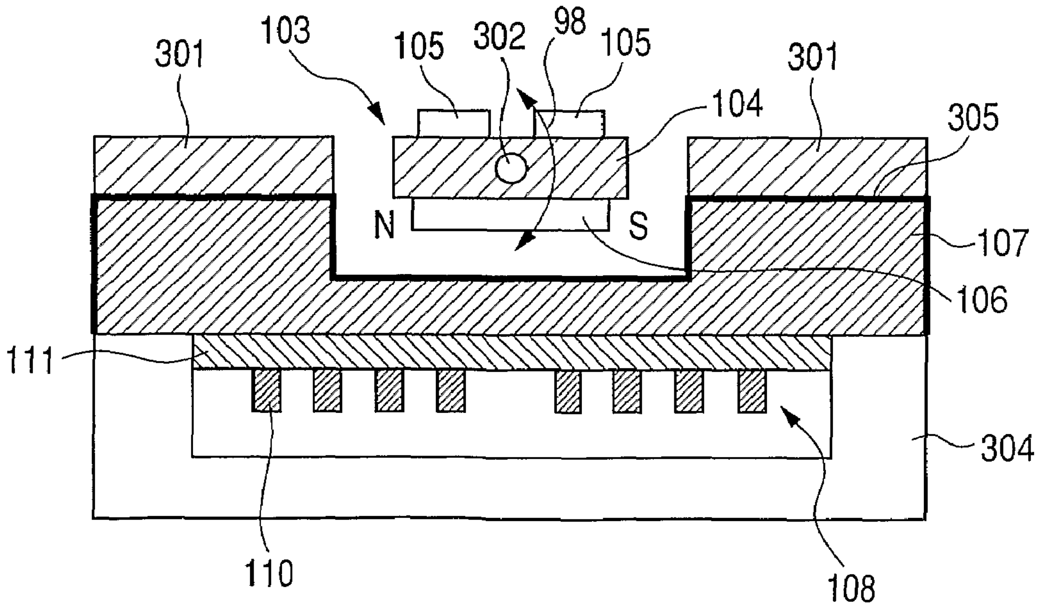
FIG. 16 is a schematic diagram for explaining another structural example of an electric potential measuring apparatus according to a seventh embodiment.
Figure 17:
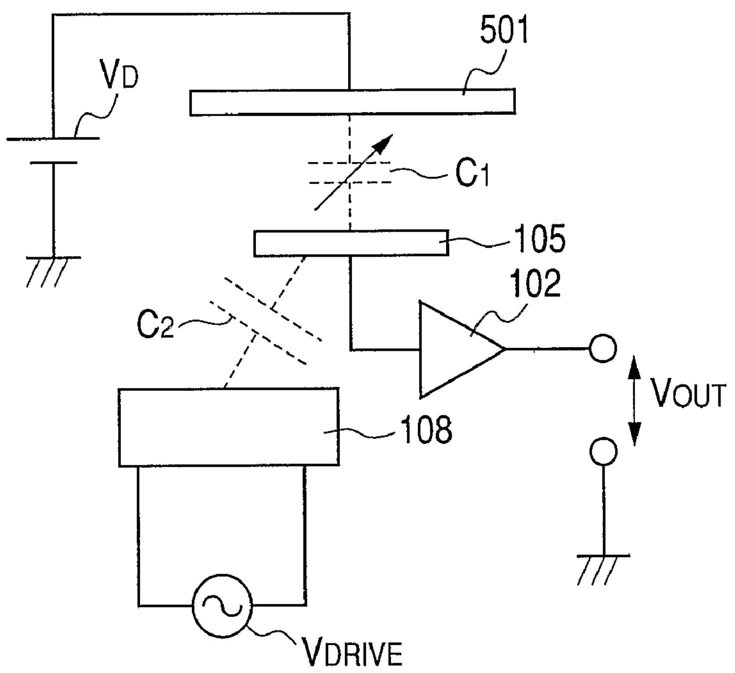
FIG. 17 is a schematic diagram showing an electric potential measuring apparatus for explaining issues which the present invention tends to solve.

An image forming apparatus of the present invention shown in FIG. 16 as a seventh embodiment differs in the constitution of the electric field shielding means 107 and magnetic force generation means 108 from the sixth embodiment. Others are the same as the sixth embodiment.

This embodiment uses the same image forming apparatus as FIG. 13, and uses the same movable portion 103 as FIG. 14. The electric field shielding means 107 is constituted of a silicon substrate, and can be easily produced using micromachining technology. The insulating layer 111 is formed on a face opposite to a face where a concavity of the electric field shielding means 107 which faces the movable portion 103 is formed. The wiring 110 which is constituted of a plane coil is formed on the insulating layer 111. That is, as shown in FIG. 16, the electric field shielding means 107 of this embodiment serves as a function of a supporting member of the magnetic force generation means 108. A metal film 305 is formed on the electric field shielding means 107, and performs the operation of lowering the specific resistance of the electric field shielding means 107 seemingly. Reference numeral 304 denotes a holding jig of the magnetic force generation means 108 and electric field shielding means 107. This holding jig 304 is constituted from aluminum and also has a function of electric field shielding means.

Since the electric potential measuring apparatus in the image forming apparatus according to this embodiment can make the electric field shielding means 107 and the magnetic force generation means 108 arranged closely, it can raise the precision of alignment. Therefore, since a magnetic force from the magnetic force generation means 108 is efficiently transferred to the magnetic force receiving means 106 as a vibration force and vibration is generated by a small drive current, it is possible further to reduce the effect of the detecting electrode 105 on the drive signal.

This application claims priority from Japanese Patent Application No. 2004-355120 filed on Dec. 8, 2004, which is hereby incorporated by reference herein.

The invention claimed is:

1. An electric potential measuring apparatus comprising:

a movable portion having a detecting electrode and a magnetic force receiver;

a magnetic force generator for generating a magnetic force, which causes the movable portion to move as a result of the magnetic force receiver receiving the magnetic force generated by the magnetic force generator;

an electric field shield located between the magnetic force generator and the movable portion, wherein the electric field shield is comprised of a nonmagnetic conductive material; and a detector for detecting an amount of an electric charge, which is electrostatically induced on the detecting electrode, wherein the electric field shield allows a magnetic field generated by the magnetic force generator to arrive at the magnetic force receiver, but shields the detecting electrode from an electric field generated by the magnetic force generator, to interrupt arrival to the detecting electrode, thereby not substantially affecting the detection by the detector.

2. The electric potential measuring apparatus according to claim 1, wherein an electric potential of the electric field shield is fixed at an arbitrary electric potential.

3. The electric potential measuring apparatus according to claim 1, wherein the electric field shield is at the same potential as the ground potential of a current-voltage conversion circuit which the detector has.

4. The electric potential measuring apparatus according to claim 1, wherein the magnetic force receiver is comprised of a ferromagnetic substance including a magnetized hard magnetic substance or a magnetized soft magnetic substance.

5. The electric potential measuring apparatus according to claim 1, wherein the magnetic force generator is a magnet coil.

6. The electric potential measuring apparatus according to claim 1, wherein the magnetic force generator is located in a space in which the electric field shield is formed.

7. The electric potential measuring apparatus according to claim 1, wherein the electric field shield holds a wiring which the magnetic force generator has.

8. An image forming apparatus comprising an electric potential measuring apparatus according to claim 1, and an image formation controller for controlling an image formation, using the electric potential measuring apparatus.

9. A method of measuring an electric potential, the method comprising the steps of:

changing a capacitance between a surface of an object to be measured and a detecting electrode, on a movable portion including a magnetic force receiver, by a mechanical vibration caused by a magnetic field being generated by a magnetic force generator and transferring as a driving force;

providing an electric field shield between the magnetic force generator and the movable portion, wherein the electric field shield is comprised of a nonmagnetic conductive material, and wherein the movable portion moves as a result of the magnetic force receiver receiving the magnetic force generated by the magnetic force generator;

detecting an amount of an electric charge electrostatically induced on the detecting electrode by the capacitance change to measure a surface potential of the object to be measured; and transmitting the magnetic field to allow an arrival of the magnetic field at the movable portion, but shielding the detecting electrode from an electric field generated by the magnetic force generator, to interrupt an arrival of the electric field at the detecting electrode by an electric field shield located in at least a space between the movable portion and the magnetic force generator, whereby the detection is not substantially obstructed.

10. An electric potential measuring apparatus comprising:

a movable portion comprised of a detecting electrode and a magnetic force receiving member;

a detecting circuit which detects a signal based on an amount of electric charge electrostatically induced on the detecting electrode;

an electromagnet for generating a magnetic field; and an electric field shield provided between the movable portion and the electromagnet, wherein the electric field shield is comprised of a nonmagnetic conductive material, and wherein (i) the electric field shield transmits the magnetic field and shields the detecting electrode from an electric field and (ii) the movable portion moves as a result of the magnetic force receiver receiving the magnetic force generated by the electromagnet.

11. An electric potential measuring apparatus comprising:

a movable portion having a detecting electrode and a magnetic force receiver, which causes the movable portion to move in response to a magnetic force;

a cantilever, which axially supports the movable portion;

a magnetic force generator for generating the magnetic force by an electric potential;

an electric field shield, which is located between the magnetic force generator and the movable portion, and which shields the detecting electrode from an electric field resulting from the electric potential, and which is comprised of a nonmagnetic conductive material; and a detector for detecting an amount of an electric charge, which is electrostatically induced on the detecting electrode.

* * * * *